(12) United States Patent
Ishikawa

(10) Patent No.: US 7,466,548 B2
(45) Date of Patent: Dec. 16, 2008

(54) COOLING DEVICE FOR COOLING A HEAT-GENERATING COMPONENT, AND ELECTRONIC APPARATUS HAVING THE COOLING DEVICE

(75) Inventor: Kenichi Ishikawa, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 178 days.

(21) Appl. No.: 11/225,253

(22) Filed: Sep. 13, 2005

(65) Prior Publication Data
US 2006/0077637 A1 Apr. 13, 2006

(30) Foreign Application Priority Data
Sep. 30, 2004 (JP) ............................. 2004-289012

(51) Int. Cl.
*H05K 7/20* (2006.01)
(52) U.S. Cl. .................. 361/698; 361/700; 165/80.3; 165/80.4; 165/104.33; 174/15.1; 174/15.2; 174/16.3
(58) Field of Classification Search ............ None
See application file for complete search history.

(56) References Cited

U.S. PATENT DOCUMENTS

| | | | |
|---|---|---|---|
| 5,764,483 A | 6/1998 | Ohashi et al. | |
| 6,006,827 A | 12/1999 | Lu | |
| 6,069,791 A | 5/2000 | Goto et al. | |
| 6,082,443 A | 7/2000 | Yamamoto et al. | |
| 6,169,660 B1 * | 1/2001 | Sarraf et al. | 361/717 |
| 6,311,767 B1 * | 11/2001 | Inoue et al. | 165/80.4 |
| 6,328,097 B1 * | 12/2001 | Bookhardt et al. | 165/104.33 |
| 6,373,700 B1 * | 4/2002 | Wang | 361/698 |
| 6,421,239 B1 * | 7/2002 | Huang | 361/696 |
| 6,535,386 B2 * | 3/2003 | Sathe et al. | 361/700 |
| 6,637,501 B2 * | 10/2003 | Lin et al. | 165/80.3 |
| 6,650,540 B2 * | 11/2003 | Ishikawa | 361/695 |
| 6,771,497 B2 * | 8/2004 | Chang et al. | 361/687 |
| 6,781,835 B2 * | 8/2004 | Hashimoto et al. | 361/697 |
| 6,804,115 B2 | 10/2004 | Lai | |
| 6,900,990 B2 * | 5/2005 | Tomioka | 361/752 |
| 6,917,521 B2 * | 7/2005 | Tomioka et al. | 361/695 |
| 6,940,717 B2 | 9/2005 | Shih-Tsung | |
| 7,079,394 B2 | 7/2006 | Mok | |
| 2003/0081382 A1 * | 5/2003 | Lin | 361/697 |
| 2004/0001316 A1 * | 1/2004 | Kamikawa et al. | 361/700 |

(Continued)

FOREIGN PATENT DOCUMENTS

JP 09-128182 5/1997

(Continued)

*Primary Examiner*—Boris Chervinsky
(74) *Attorney, Agent, or Firm*—Blakely, Sokoloff, Taylor & Zafman LLP.

(57) ABSTRACT

A cooling device having a heat receiving portion, a heat radiating portion, a heat pipe, and a fan. The heat receiving portion is held on a wiring board and thermally connected to a heat-generating component. The heat radiating portion radiates the heat generated by the heat-generating component, at a position remote from the heat receiving portion. The heat pipe transfers the heat generated by the heat-generating component, from the heat receiving portion to the heat radiating portion. The heat pipe couples the heat receiving portion and the heat radiating portion. The fan applies cooling air to the heat radiating portion. The fan is coupled to the heat radiating portion.

12 Claims, 12 Drawing Sheets

U.S. PATENT DOCUMENTS

2006/0181851 A1 * 8/2006 Frank et al. .................. 361/700

FOREIGN PATENT DOCUMENTS

| JP | 11-015425 | 1/1999 |
| JP | 2001-119183 | 4/2001 |
| JP | 2003-101272 | 4/2003 |
| JP | 2003-258472 | 9/2003 |
| JP | 2004-31606 | 1/2004 |

* cited by examiner

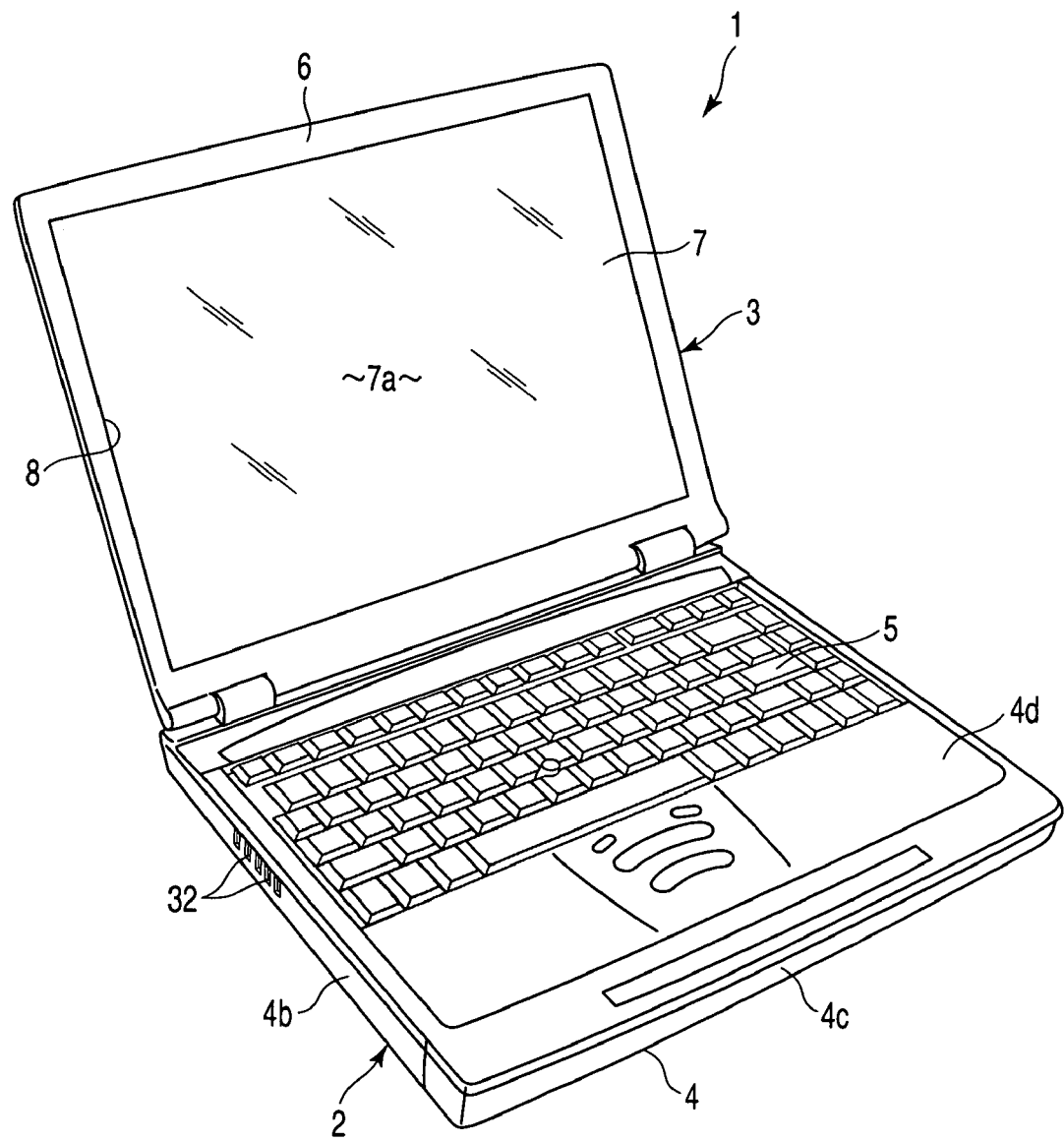
F I G. 1

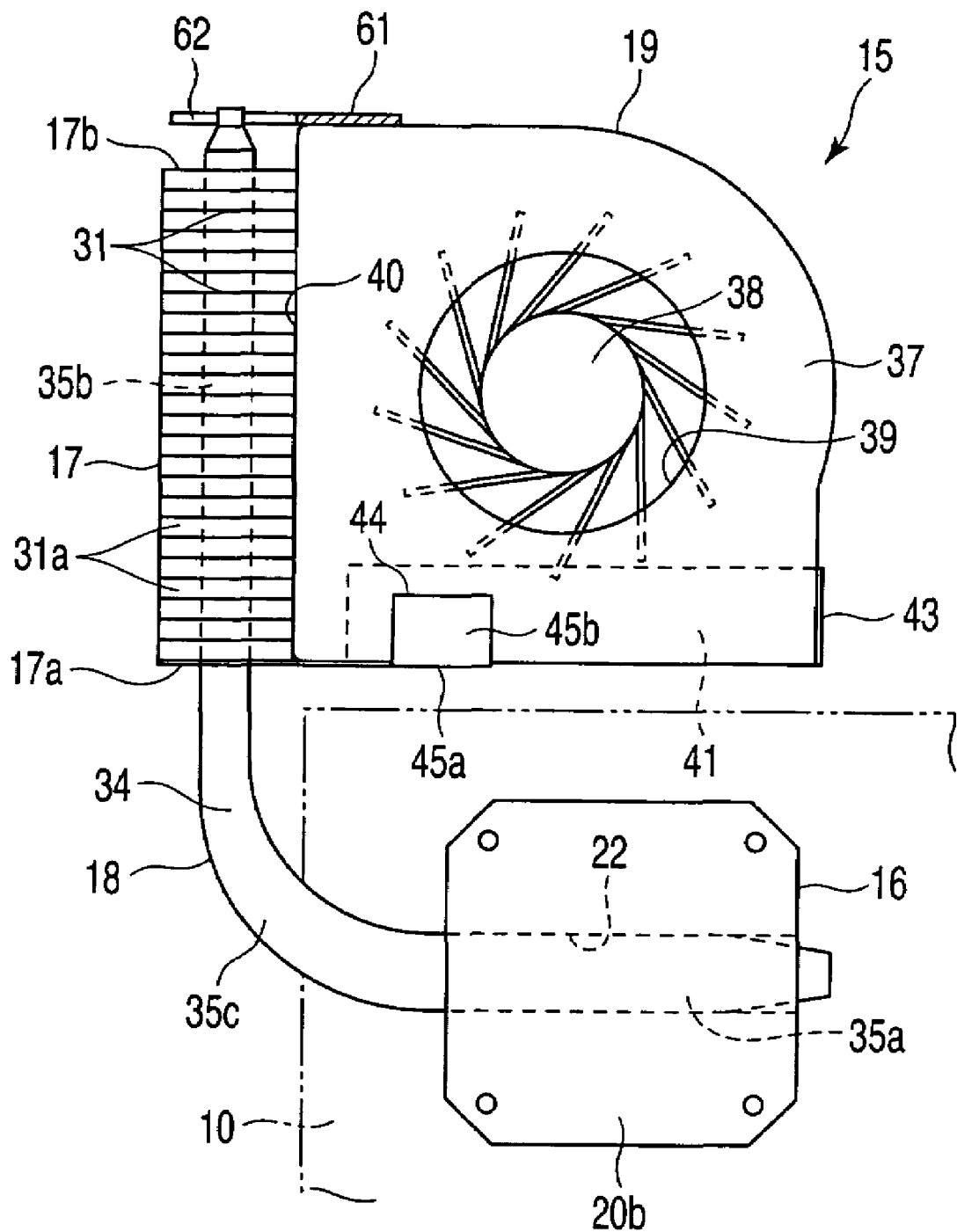
F I G. 10

COOLING DEVICE FOR COOLING A HEAT-GENERATING COMPONENT, AND ELECTRONIC APPARATUS HAVING THE COOLING DEVICE

CROSS-REFERENCE TO RELATED APPLICATIONS

This application is based upon and claims the benefit of priority from prior Japanese Patent Application No. 2004-289012, filed Sep. 30, 2004, the entire contents of which are incorporated herein by reference.

BACKGROUND

1. Field

The present invention relates to a cooling device having a heat-radiating portion for radiating heat from a heat-generating component and a fan for applying cooling air to the heat radiating portion, and to an electronic apparatus, such as a portable computer, which incorporates this cooling device.

2. Description of the Related Art

A CPU is incorporated in electronic apparatuses such as portable computers. The heat that a CPU generates while operating increases as its data-processing speed rises or as it performs more and more functions. The higher the temperature of the CPU, the less efficiently the CPU operates or the more likely it may fail to operate.

Any electronic apparatus comprising a CPU that generates much heat while operating incorporates a cooling device that cools the CPU. The cooling device is provided in the housing of the electronic apparatus, along with the other major components of the apparatus, such as the wiring board and the hard disk drive.

The conventional cooling device has a heat receiving portion, a heat radiating portion, a heat pipe, and a fan. The heat receiving portion is thermally coupled to a CPU. The heat radiating portion radiates is spaced apart from the heat receiving portion and radiates heat from the CPU. The heat pipe transfers the heat of the CPU to the heat radiating portion. The fan has an air outlet port, through which cooling air is supplied to the heat radiating portion.

In the conventional cooling device, the heat of the CPU is transferred from the heat receiving portion through the heat pipe to the heat radiating portion. The heat radiating portion is cooled with the cooling air applied from the fan. The heat of the CPU, transferred to the heat radiating portion, is released from the housing by virtue of heat exchange with the cooling air. The ambient temperature of the CPU is thereby maintained at such a value that the CPU operates well.

The heat pipe mechanically connects the heat receiving portion and the heat radiating portion. Thus, the heat receiving portion, heat radiating portion and heat pipe constitute one module. The module is held on the wiring board, on which the heat receiving portion is provided, with the CPU mounted on it. The fan is fastened, with screws, to the inner surface of the housing, with its air outlet port opposed to the heat radiating portion. The fan and heat radiating portion are located side by side, away from the heat receiving portion.

In the conventional cooling device, the position of the heat radiating portion is determined by that of the heat receiving portion that is held on the wiring board. By contrast, the position of the fan is determined by that of the inner surface of the housing. In other words, their positions depend on the positions of different components, which are likely to change. Their positions inevitably differ from the desired ones. In some cases, a large gap develops between the heat radiating portion and the fan, and the cooling air flowing toward the heat radiating portion inevitably leaks through this gap.

A cooling device is known, which has a duct that extends to the air outlet port of a fan to prevent the leakage of cooling air. In this cooling device, the duct surrounds the heat radiating portion, thereby preventing the cooling air from leaking through the gap between the heat radiating portion and the air outlet port of the fan. Jpn. Pat. Appln. KOKAI Publication 2003-101272, for example, discloses an electronic apparatus that has a cooling device of this type.

In the cooling device disclosed in the above-identified Japanese publication, the heat pipe connects the heat receiving portion to the heat radiating portion that is surrounded by the duct. The duct has through holes that guide the heat pipe. These holes have a far larger diameter than the heat pipe, in order to compensate for the changes in position of the fan and heat radiating portion. Inevitably, a gap develops between the heat pipe and the rim of each through hole.

Consequently, the cooling air coming from the fan leaks through the gap. The cooling air is applied to the heat radiating portion in a smaller amount than otherwise. The heat radiating portion cannot be efficiently cooled. Ultimately, the CPU may not be cooled sufficiently.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a perspective view of a portable computer according to a first embodiment of this invention;

FIG. 10 is a plan view of a cooling device according to a third embodiment of the present invention;

DETAILED DESCRIPTION OF SEVERAL EMBODIMENTS

The first embodiment of the invention will be described, with reference to FIGS. 1 to 8.

Figure 2:
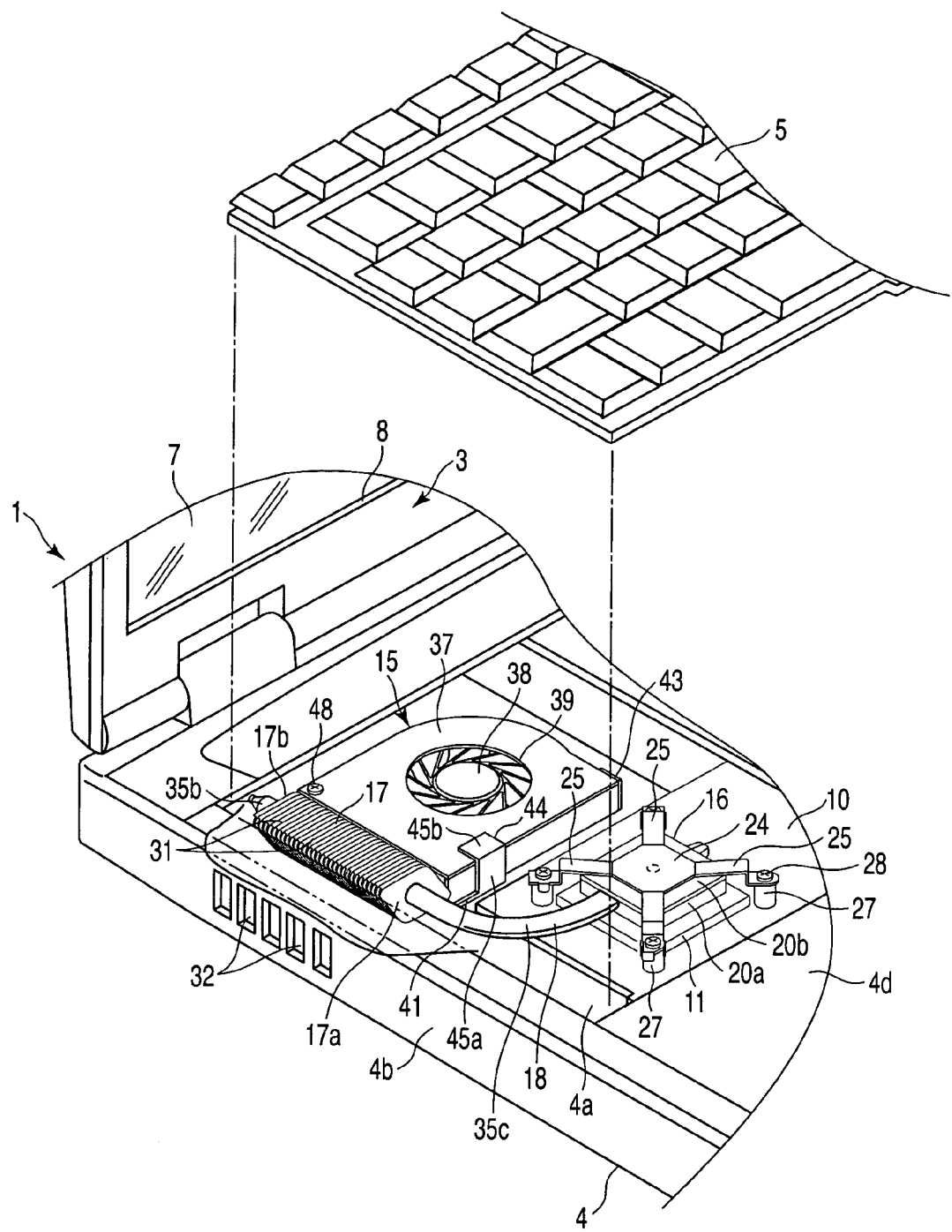
FIG. 2 is a perspective view of the portable computer, showing the cooling device incorporated in the housing of the portable computer and configured to cool the CPU of the portable computer.

FIGS. 1 and 2 show a portable computer 1, i.e., an electronic apparatus according to this invention. The portable computer 1 comprises a main unit 2 and a display unit 3. The main unit 2 has a housing 4 shaped like a flat box. The housing 4 has a bottom wall 4a, left and right side walls 4b, front wall 4c and top wall 4d. The top wall 4d supports a keyboard 5.

The display unit 3 has a display housing 6 and a liquid-crystal display panel 7. The display housing 6 holds the liquid-crystal display panel 7. The display housing 6 is coupled to the rear edge of the housing 4 with hinges (not shown) and can be rotated between a closed position and an opened position. The liquid-crystal display panel 7 has a display screen 7a, which is exposed outside through the opening 8 made in the front of the display housing 6.

As FIG. 2 shows, the housing 4 contains a printed wiring board 10. The printed wiring board 10 is secured to the bottom wall 4a and extends parallel thereto. A central processing unit 11 (hereinafter referred to as "CPU") is mounted on the upper surface of the printed wiring board 10. The CPU 11 is an example of a heat-generating component. As can be seen from FIGS. 3 and 5, the CPU 11 is a BGA-type semiconductor package. The CPU 11 has a base substrate 12 and an IC chip 13. The base substrate 12 is soldered to the upper surface of the printed wiring board 10. The IC chip 13 is mounted on the center part of the base substrate 12. The IC chip 13 generates much heat while operating. The IC chip 13 must be cooled to keep performing stable operation.

As shown in FIG. 2, the housing 4 contains a cooling device 15 that is configured to cool the CPU 11. As FIGS. 2 to 4 show, the cooling device 15 comprises a heat receiving portion 16, a fin unit 17, a heat pipe 18, and a centrifugal fan 19.

The heat receiving portion 16 is provided on the CPU 11. It is rectangular, a little larger than the IC chip 13. The heat receiving portion 16 has a heat-receiving block 20a and a top plate 20b. The block 20a and plate 20b are made of metal having high thermal conductivity, such as copper or aluminum alloy.

The lower surface of the heat-receiving block 20a is flat, serving as a heat-receiving surface 21. The heat-receiving surface 21 faces the IC chip 13 of the CPU 11. The heat-receiving block 20a has a groove 22 cut in the upper surface. The groove 22 runs across the block 20a and opens at the circumferential surface thereof. The top plate 20b is secured to the upper surface of the heat-receiving block 20a by means of, for example, caulking. The top plate 20b covers the groove 22 from above.

Figure 3:
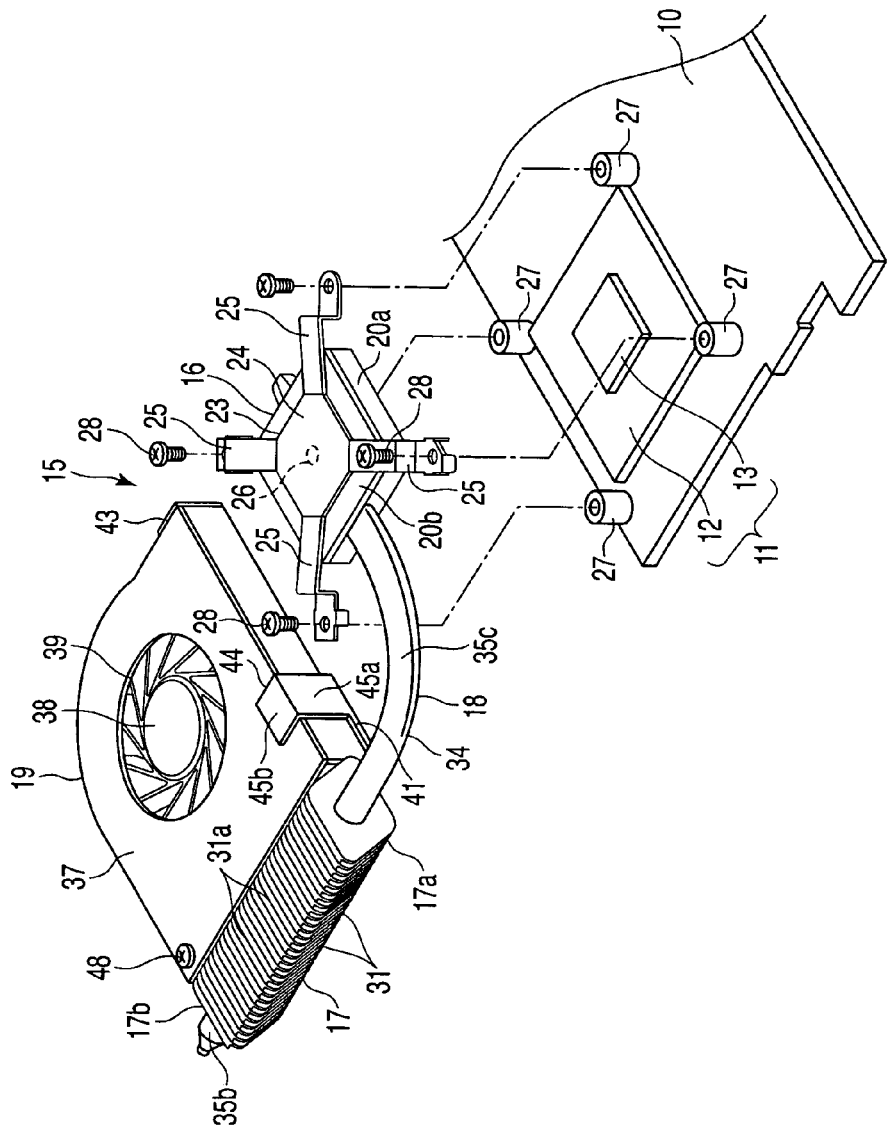
FIG. 3 is a perspective view, representing the positional relation that the cooling device and the CPU assume in the first embodiment of the invention.
Figure 4:
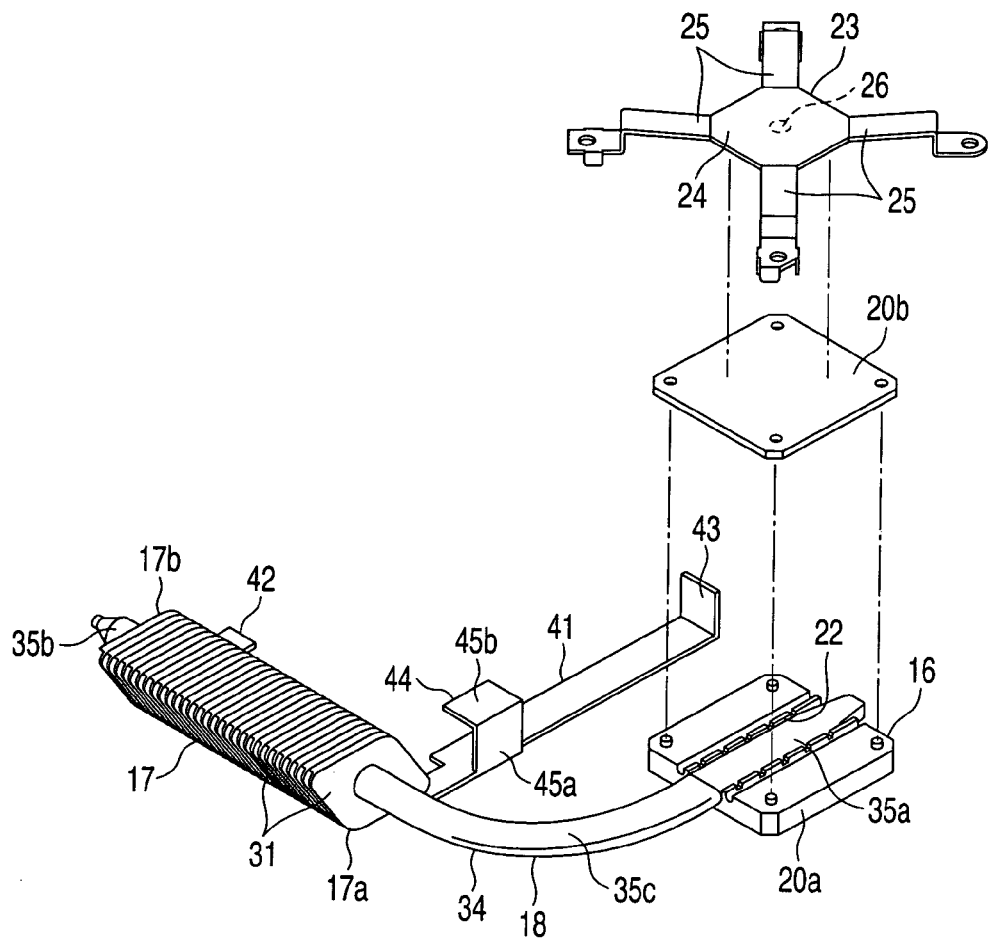
FIG. 4 is a perspective view illustrating the positional relation that the heat receiving portion, heat radiating portion and heat pipe take in the first embodiment of the invention.
Figure 5:
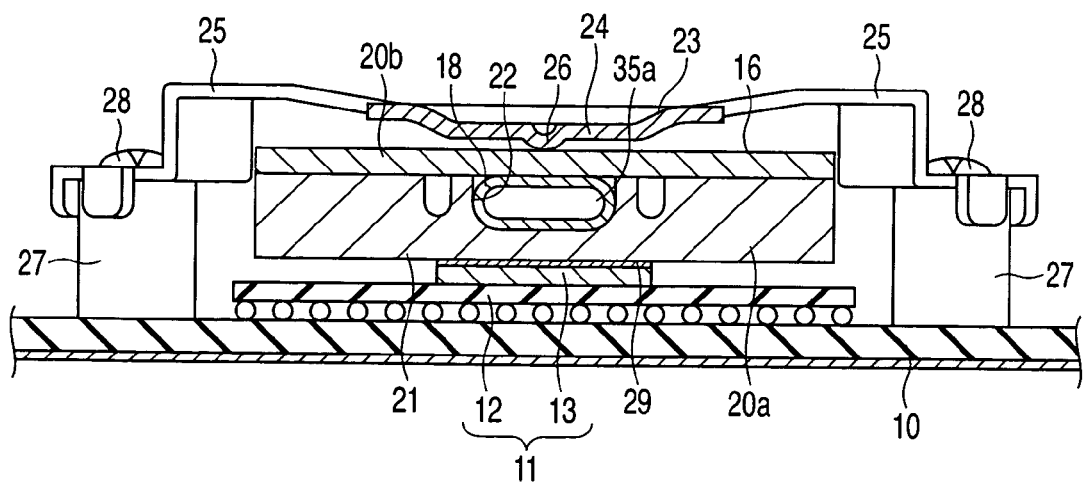
FIG. 5 is a sectional view depicting the CPU and heat receiving portion that are thermally connected in the first embodiment of the invention.

As FIGS. 3 and 5 depict, a spring member 23 holds the heat receiving portion 16 to the printed wiring board 10. The spring member 23 has a square pushing plate 24 and four arms 25. The pushing plate 24 has a projection 26 at the center part of the upper surface of the top plate 20b. The arms 25 extend in radial direction from the four corners of the pushing plate 24. Four bosses 27 protrude from the upper surface of the printed wiring board 10. Four screws 28 are driven in these bosses 27, respectively, fastening the distal ends of the arms 25 to the bosses 27.

The arms 25 resiliently press the pushing plate 24 on the top plate 20b. The heat-receiving surface 21 of the heat-receiving block 20a is therefore pushed to the IC chip 13. Thermally conductive grease 29 is applied between the IC chip 13 and the heat-receiving surface 21. As a result, the heat receiving portion 16 takes a specific position with respect to the printed wiring board 10 and the heat-receiving surface 21 is thermally connected to the IC chip 13.

Figure 6:
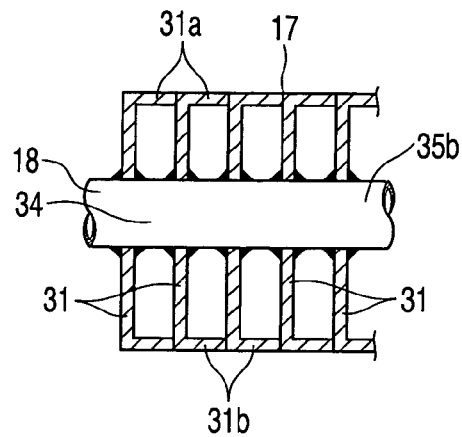
FIG. 6 is a sectional view, illustrating the heat pipe and the fin unit that are thermally connected in the first embodiment of the invention.
Figure 7:
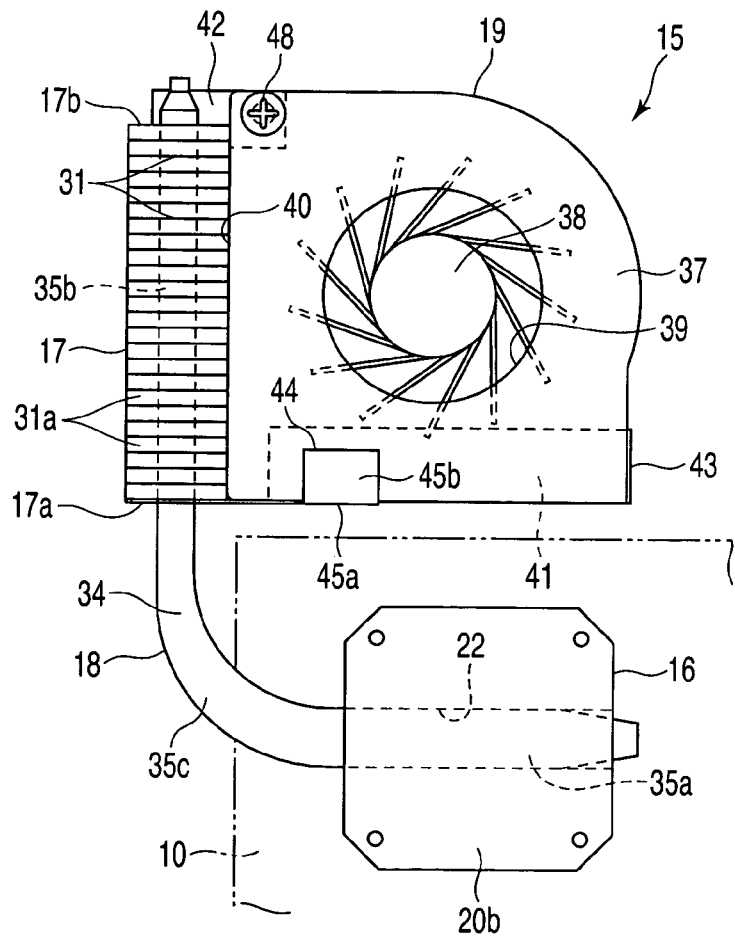
FIG. 7 is a plan view of the cooling device used in the first embodiment of the invention.
Figure 8:
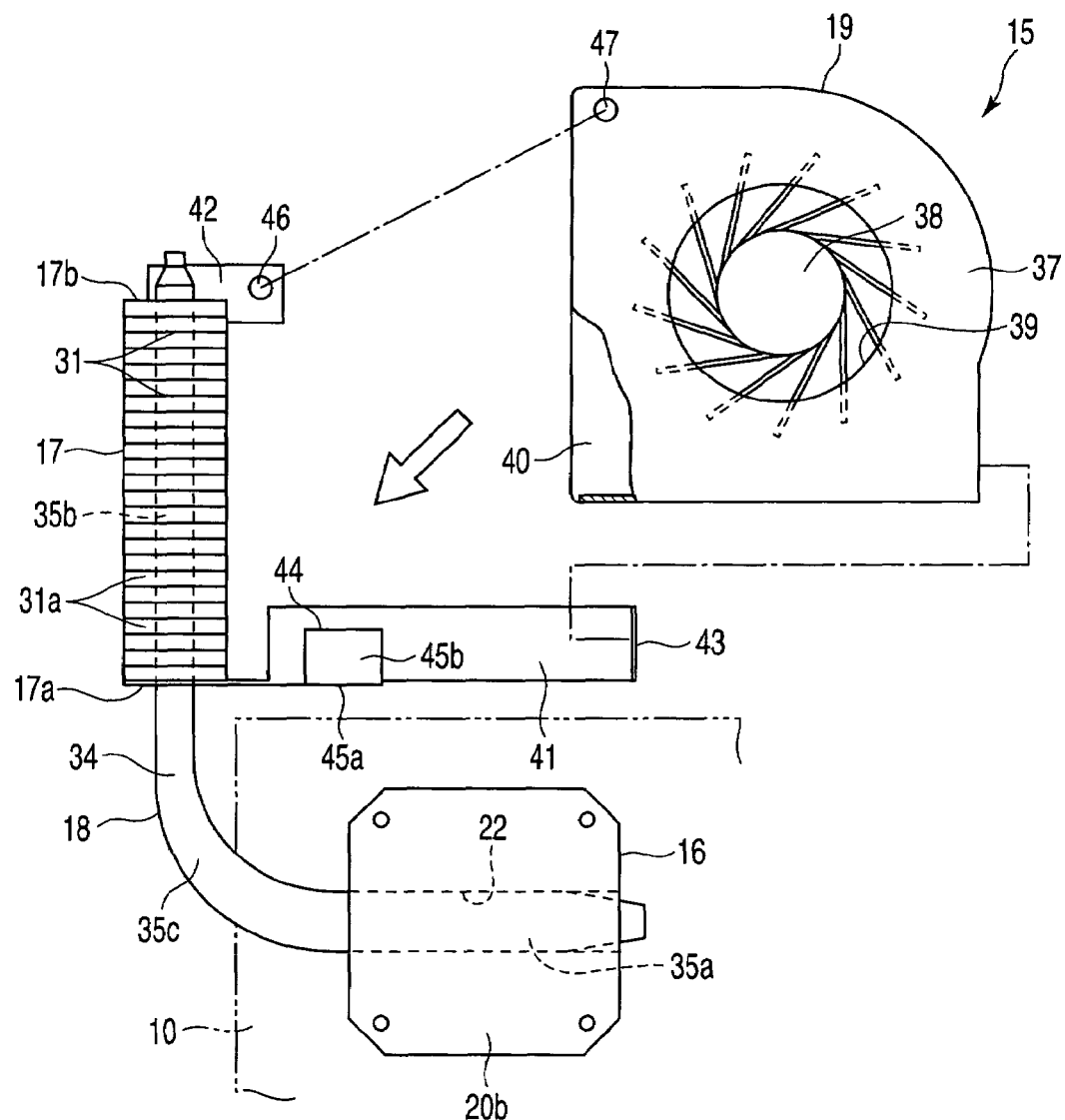
FIG. 8 is a plan view showing the fin unit and centrifugal fan that are spaced apart in the first embodiment of the invention.

The fin unit 17 is a heat radiating portion. As FIG. 6 shows, the fin unit 17 has a plurality of heat-exchanging plates 31. The heat-exchanging plates 31 are made of metal having high thermal conductivity, such as copper. Each heat-exchanging plate 13 has two flanges 31a and 31b. The flanges 31a and 31b have been formed by bending the upper and lower edges of a rectangular plate, each at right angle. Each heat-exchanging plate 31 has its flanges 31a and 31b abutting on those of the next heat-exchanging plate. Thus, the heat-exchanging plates 31 are arranged parallel to, and spaced apart from, one another.

The fin unit 17 has a first end part 17a and a second end part 17b. The first end part 17a is located at one end of the row of the heat-exchanging plates 31. The second end part 17b is located at the other end of the row of the heat-exchanging plates 31.

The fin unit 17 extends along the left side wall 4b of the housing 4 and is spaced apart from the heat receiving portion 16 that is provided on the printed wiring board 10. The fin unit 17 is opposed to an exhaust port 32 that is made in the left side wall 4b.

The heat pipe 18 is a heat-transferring component. As FIG. 4 shows, the heat pipe 18 has a container 34 containing liquid coolant. The container 34 has a heat-receiving part 35a, a heat-radiating part 35b, and a curved part 35c. The heat-receiving part 35a is a flat member that is fitted in the groove 22 cut in the heat-receiving block 20a. The heat-receiving part 35a is clamped between the top plate 20b and the inner surface of the groove 22. Thus, the heat-receiving part 35a of the heat pipe 18 is thermally connected to the heat receiving portion 16.

The heat-radiating part 35b penetrates the center part of each heat-exchanging plates 31 of the fin unit 17 and is thermally connected to the heat-exchanging plates 31. The distal end of the heat-radiating part 35b protrudes from the fin unit 17, more precisely from the second end part 17b of the fin unit 17.

The curved part 35c extends between the heat-receiving part 35a and heat-radiating part 35b and connects these parts 35a and 36b to each other. Connected by the curved part 35c, the heat-receiving part 35a and heat-radiating part 35b extend at right angles to each other.

The container 34 of the heat pipe 18 is a pipe made of metal such as aluminum. It is rigid, not liable to be bent. Therefore, the container 34 couples the heat receiving portion 16 and the fin unit 17 and holds them in a predetermined positional relation. Thus, the heat receiving portion 16, fin unit 17 and heat pipe 18 constitute one module. Hence, the position of the fin unit 17 takes with respect to the housing 4 and printed wiring board 10 is determined by the position of the heat receiving portion 16.

As shown in FIGS. 2 and 3, the centrifugal fan 19 has a fan case 37 and an impeller 38. The fan case 37 is shaped like a flat box and has a pair of inlet ports 39 (only one is shown) and an outlet port 40. The outlet port 40 is a rectangular opening and is as long as the fin unit 17.

The fan case 37 contains the impeller 38 and a motor (not shown). The impeller 38 is fastened to the shaft of the motor. When driven by the motor, the impeller 38 draws air into the fan case 37 through the inlet ports 39. In the fan case 37, the air flows to the center of the impeller 38. Then, the air flows from the circumference of the impeller 38 to the outlet port 40 of the fan case 37.

The centrifugal fan 19 is integrally formed with the fin unit 17, with its outlet port 40 opposed to the fin unit 17. The fin unit 17 has a first bracket 41 and a second bracket 42 as illustrated in FIGS. 4 to 8. The brackets 41 and 42 hold the fan case 37.

The first bracket 41 is fastened to the heat-exchanging plate 31 that is located at the first end part 17a of the fin unit 17. The first bracket 41 projects from the first end part 17a toward the fan case 37. The first bracket 41 is shaped like a strip and as long as the fan case 37 is deep. The fan case 37 contacts, at one side, the first bracket 14.

The first bracket 41 has a first holding part 43 and a second holding part 44. The first holding part 43 has been formed by bending the distal end of the first bracket 41 upward at right angle. The first holding part 43 faces the first end part 17a of the fin unit 17 and contacts that side of the fan case 37 which faces away from the outlet port 40.

The second holding part 44 lies between the first end part 17a of the fin unit 17 and the first holding part 43. The second holding part 44 has a standing strip 45a and a holding strip 45b. The standing strip 45a vertically extends from the side edge of the first bracket 41. The holding strip 45b horizontally extends from the upper edge of the standing strip 45a and opposes the first bracket 41. The holding strip 45b cooperates with the first bracket 41, resiliently clamping one side-part of the fan case 37.

The second bracket 42 is integrally formed with the heat-exchanging plate 31 that is located at the second end part 17b of the fin unit 17. The second bracket 42 extends from the second end part 17b of the fin unit 17 toward the fan case 37. The other end part of the fan case 37 is mounted on the second bracket 42. The second bracket 42 has a screw hole 46. The screw hole 46 is axially aligned with a through hole 47 that is made in the other-side part of the fan case 17.

To fasten the centrifugal fan 19 to the fin unit 17, the fan case 37 is mounted on the first bracket 41 and second bracket 42. Then, the end of the fan case 37, which faces away from the outlet port 40, abuts on the first holding part 43 of the first bracket 41. At the same time, the one-side part of the fan case 37 slips into the gap between the first bracket 41 and the holding strip 45b of the second holding part 44 and is clamped between the first bracket 41 and the holding strip 45b. Further, the through hole 47 of the fan case 37 comes into axial alignment with the screw hole 46 of the second bracket 42.

A screw 48 is inserted from above into the through hole 47 of the fan case 37 and then driven into the screw hole 46 of the second bracket 42. As a result, the screw 48 fastens the fan case 37 to the first bracket 41 and second bracket 42. The fin unit 17 and the centrifugal fan 19 are thereby coupled.

Once the centrifugal fan 19 has been fastened to the fin unit 17, the outlet port 40 of the fan case 37 faces the fin unit 17, providing no gaps between the fin unit 17 and the outlet port 40.

When the portable computer 1 is used, the IC chip 13 of the CPU 11 generates heat. The heat receiving portion 16 transmits the heat from the IC chip 13 to the heat-receiving part 35a of the heat pipe 18. The liquid coolant in the heat-receiving part 35a is heated and evaporated. The resultant vapor flows from the heat-receiving part 35a to the heat-radiating part 35b. The vapor is condensed in the heat-radiating part 35b. The condensation releases the heat from the heat-radiating part 35b. The heat is conducted to the fin unit 17 and radiated from the heat-exchanging plates 31.

The vapor is liquefied into liquid coolant in the heat-radiating part 35b. The liquid coolant flows back into the heat-receiving part 35a, by virtue of capillary force. In the heat-receiving part 35a, the liquid receives the heat from the IC chip 13. As the liquid coolant repeatedly undergoes evaporation and condensation, the heat generated by the IC chip 13 is transferred to the fin unit 17.

The motor provided in the fan case 37 starts driving the impeller 38 when the temperature of the IC chip 13 reaches a predetermined value. Thus driven, the impeller 38 draws air from the housing 4 into the fan case 37 through the inlet ports 39. The air thus drawn is applied as cooling air from the outlet port 40. The cooling air flows through the gaps between the heat-exchanging plates 31 of the fin unit 17.

As the cooling air so flows, it takes the heat from the heat-exchanging plates 31, i.e., the heat generated by the IC chip 13 and transmitted to the plates 31. The cooling air heated due to the heat exchange at the fin unit 17 is discharged from the main unit 2 of the portable computer 1 through the exhaust port 32 of the housing 4.

The first and second brackets 41 and 42 of the fin unit 17 hold the centrifugal fan 19 that applies cooling air to the fin unit 17, in the first embodiment of the invention. In other words, the centrifugal fan 19 is held in a specific position with respect to the fin unit 17 that receives the cooling air. It is well aligned with the fin unit 17 in terms of position.

Therefore, there are no gaps between the fin unit 17 and the centrifugal fan 19. The cooling air would not leak at the junction between the fin unit 17 and the centrifugal fan 19. The cooling air is always applied in a sufficient amount to the fin unit 17. The fin unit 17 can therefore radiate heat at high efficiency. Thus, the cooling device 15 can attain high heat-radiating efficiency without fail. That is, the device 15 can cool the CPU 11 well, helping the CPU 11 to operate as is desired.

To separate the fin unit 17 and the centrifugal fan 19 from each other, it suffices to take out the screw 48 from the screw hole 46 of the second bracket 42 and then to pull the fan case 37 from the second holding part 44. Thus, it is easy to remove the centrifugal fan 19 from the fin unit 17. This facilitates the maintenance of the centrifugal fan 19.

To reduce this embodiment to practice, a seal made of heat-resistance rubber or foamed rubber may be interposed between the fin unit 17 and the outlet port 40 of the fan case 37. Then, no cooling air will leak at the boundary between the fin unit 17 and the fan case 37. This can further enhance the heat-radiating efficiency of the fin unit 17.

Figure 9:
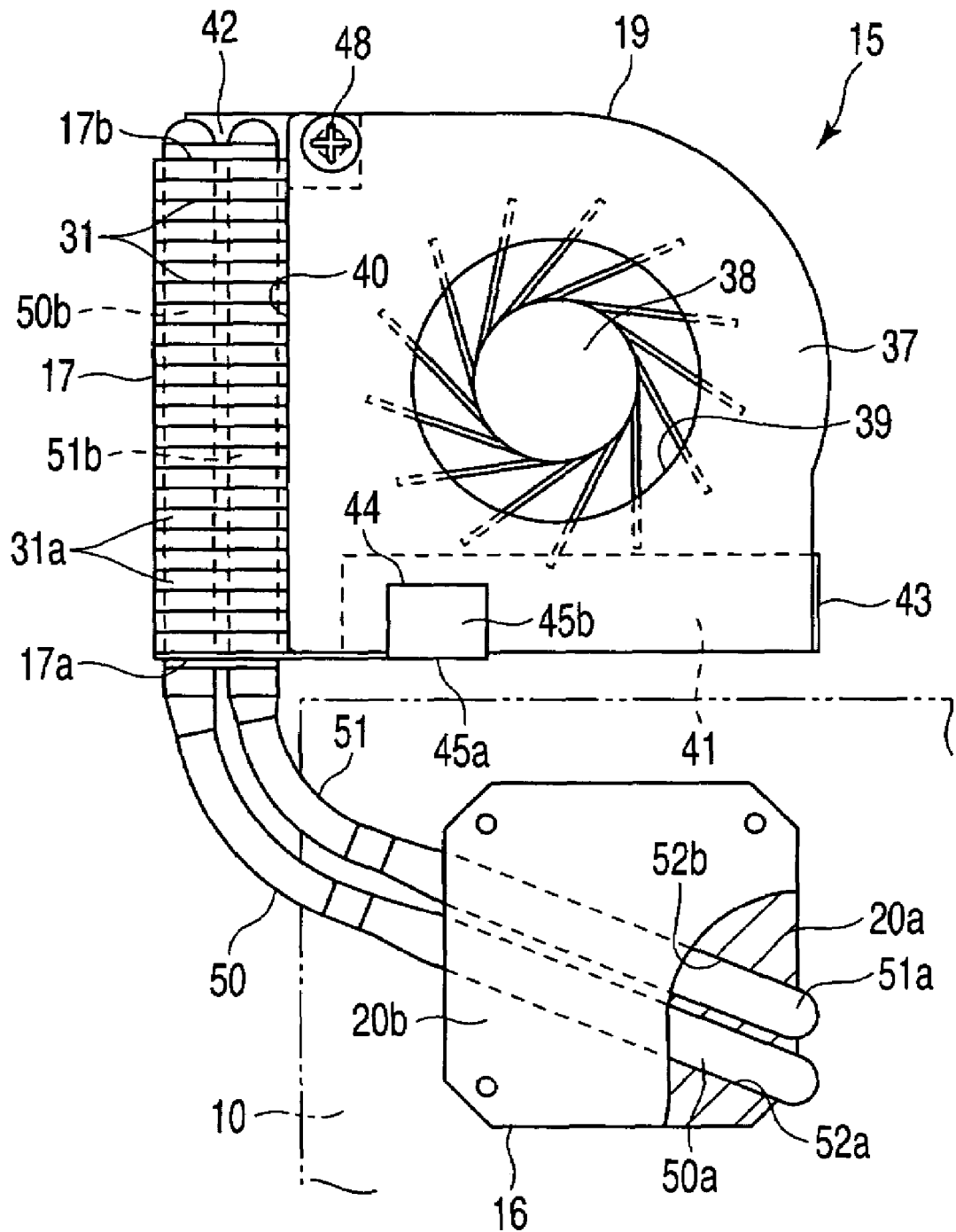
FIG. 9 is a plan view of a cooling device according to a second embodiment of this invention.

This invention is not limited to the first embodiment described above. A second embodiment of the invention will be described, with reference to FIG. 9.

The second embodiment differs from the first embodiment in that two heat pipes 50 and 51 transfer heat from the heat receiving portion 16 to the fin unit 17. In any other structural respect, the cooling device 15 according to the second embodiment is identical to the first embodiment.

In the second embodiment, the heat pipes 50 and 51 extend parallel to each other, between the heat receiving portion 16 and the fin unit 17. The heat pipe 50 has a heat-receiving part 50a and a heat-radiating part 50b. Similarly, the heat pipe 51 has a heat-receiving part 51a and a heat-radiating part 51b.

The heat-receiving block 20a of the heat receiving portion 16 has two grooves 52a and 52b cut in the upper surface. The grooves 52a and 52b extend parallel and spaced apart. The heat-receiving part 50a of the heat pipe 50 and the heat-receiving part 51a of the heat pipe 51 are fitted in the grooves 52a and 52b, respectively. The heat-radiating part 50b of the heat pipe 50 and the heat-radiating part 51b of the heat pipe 51 penetrate the heat-exchanging plates 31 of the fin unit 17. Therefore, the heat-receiving part 50a of the heat pipe 50 and the heat-receiving part 51a of the heat pipe 51 are thermally connected to the heat receiving portion 16, and the heat-radiating parts 50b and 51b are thermally connected to the fin unit 17.

Figure 11:
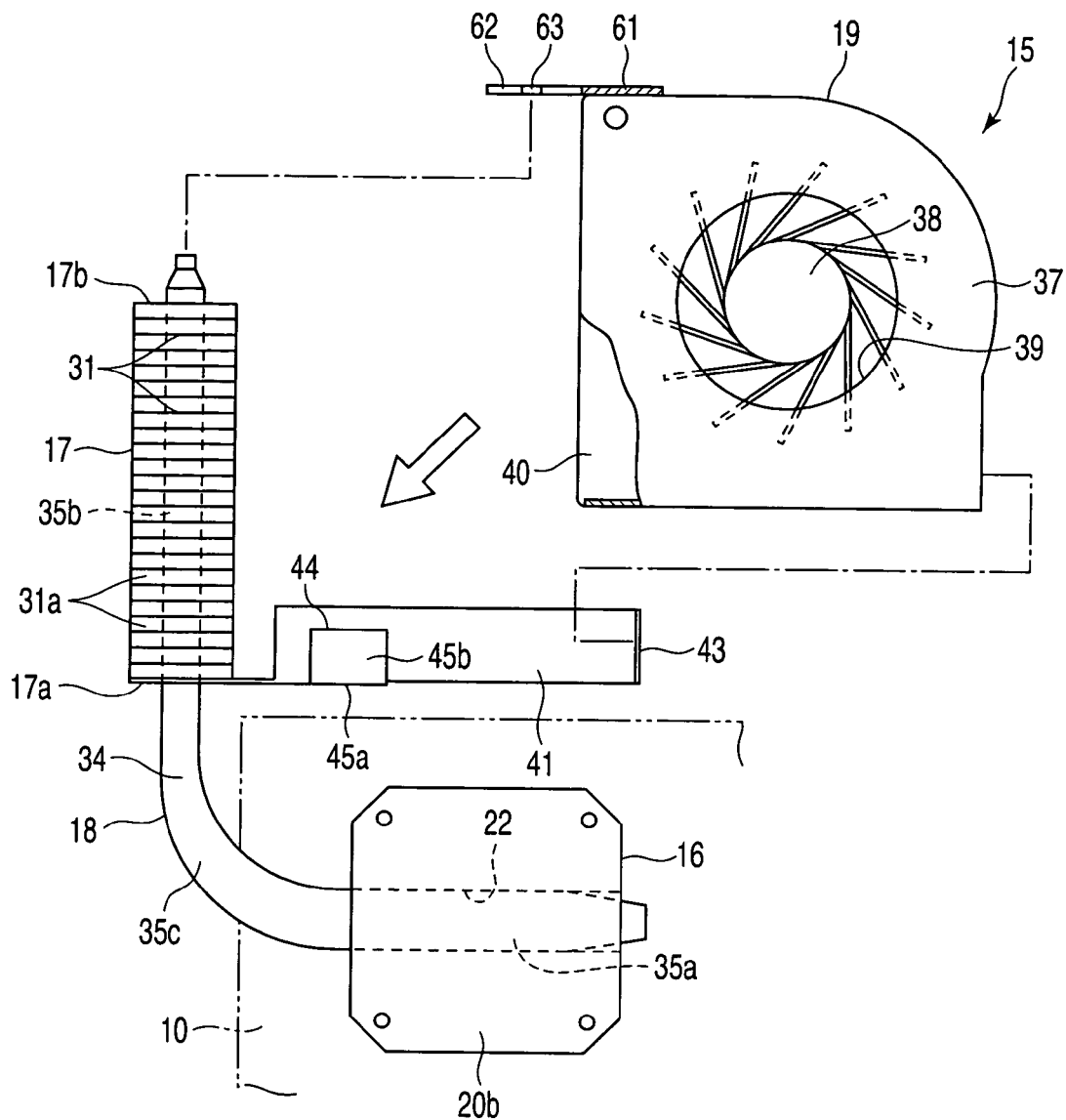
FIG. 11 is a plan view showing the fin unit and centrifugal fan that are spaced apart in the third embodiment of the invention.
Figure 12A:
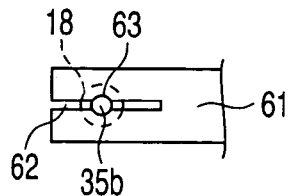
FIG. 12A is a side view showing the heat pipe having its heat-radiating end fitted in the slit of the second bracket in the third embodiment.
Figure 12B:
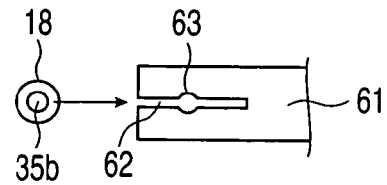
FIG. 12B is a side view showing the heat pipe having its heat-radiating end removed from the slit of the second bracket in the third embodiment.

FIGS. 10 to 12 depicts a third embodiment of this invention.

In the third embodiment, the fin unit 17 has the first bracket 41 and the fan case 37 has a second bracket 61. The first bracket 41 has the same structure as its counterpart of the first embodiment. It is therefore designated at the same reference numeral and will not be described in detail.

The second bracket 61 is a flat plate. The second bracket 61 is secured to one side of the fan case 37 and protrudes from the outlet port 40 toward the second end part 17b of the fin unit 17. The second bracket 61 has a slit 62. In the slit 62, there is removably inserted the distal end of the heat-radiating part 35b of the heat pipe 18. The slit 62 extends straight from the distal end of the second bracket 61 toward the fan case 37. The slit 62 is narrower than the diameter of distal end of the heat-radiating part 35b. The slit 62 has, at the midpoint, a holding part 63, in which the distal end of the heat-radiating part 35b is fitted.

To assemble the centrifugal fan 19 into the fin unit 17, the distal end of the heat-radiating part 35b of the heat pipe 18 is inserted into the slit 62 of the second bracket 61. For the same purpose, the fan case 37 is mounted on the first bracket 41, with its one side projecting from the fin unit 17.

Next, the distal end of the heat-radiating part 35b is guided to the holding part 63 through the slit 62, until the side of the fan case 37, which faces away from the outlet port 40, abuts on the first holding part 43 of the first bracket 41. Then, the one-side part of the fan case 37 is fitted in the gap between the first bracket 41 and the holding strip 45b of the second holding part 44.

Thus, the first and second brackets 41 and 61 couple the fan case 37 and the fin unit 17 together.

In the third embodiment, too, the centrifugal fan 19 can assume a specific position with respect to the fin unit 17 that receives cooling air. Hence, the centrifugal fan 19 and the fin unit 17 can be positioned with respect to each other with high precision. No gaps are therefore made between the centrifugal fan 19 and the fin unit 17. Thus, the cooling air would not leak at the junction between the fan 19 and the fin unit 17.

Figure 13:
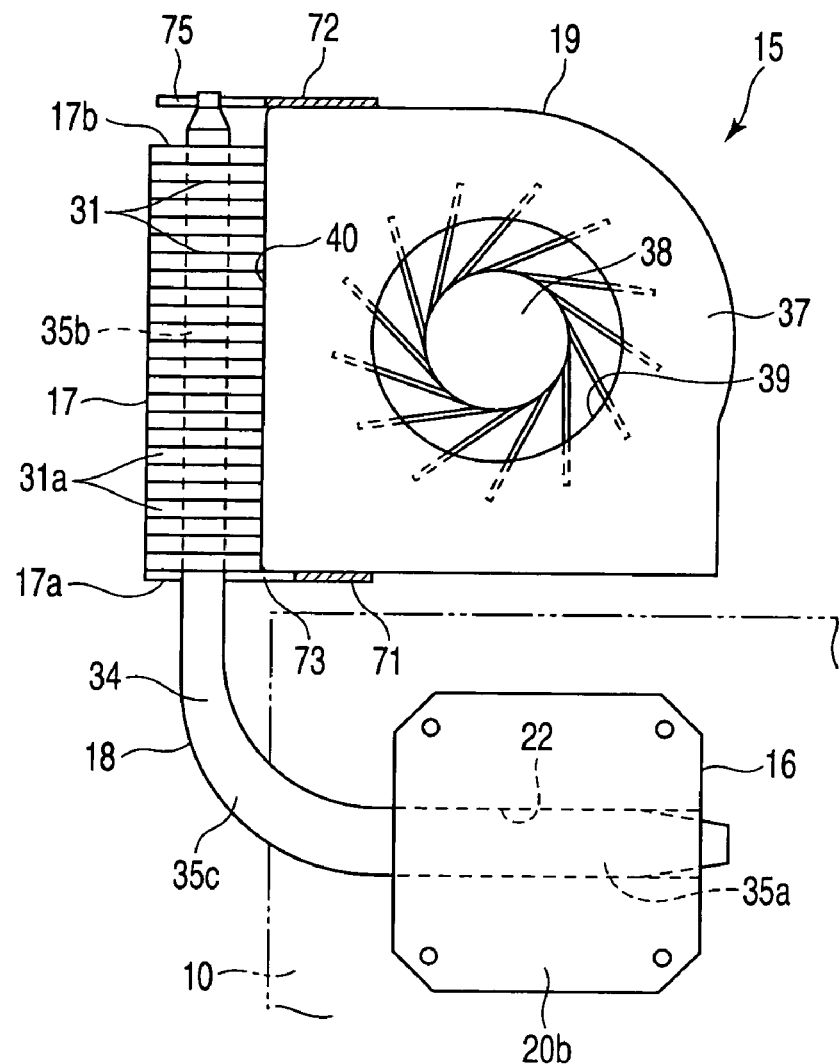
FIG. 13 is a plan view of a cooling device according to a fourth embodiment of the present invention.
Figure 14A:
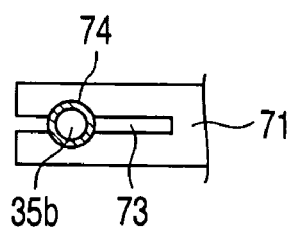
FIG. 14A is a side view showing the heat pipe having its heat-radiating end fitted in the slit of the first bracket in the fourth embodiment.
Figure 14B:
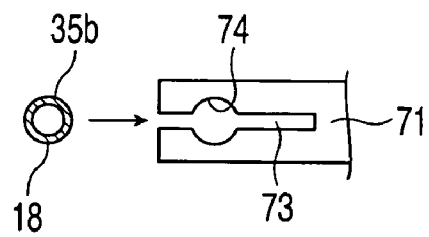
FIG. 14B is a side view showing the heat pipe having its heat-radiating end removed from the slit of the first bracket in the fourth embodiment.
Figure 15A:
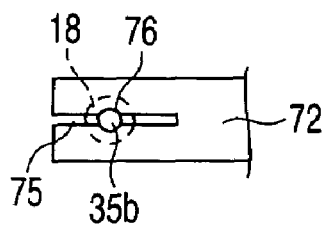
FIG. 15A is a side view showing the heat pipe having its heat-radiating end fitted in the slit of the second bracket in the fourth embodiment.
Figure 15B:
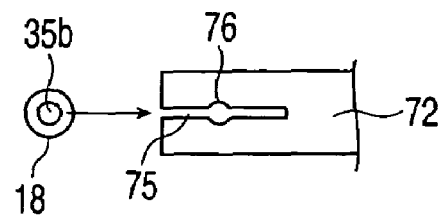
FIG. 15B is a side view showing the heat pipe having its heat-radiating end removed from the slit of the second bracket in the fourth embodiment.

FIGS. 13 to 15 illustrates a fourth embodiment of the present invention.

The fourth embodiment differs from the first embodiment in the structure that connects the fin unit 17 and the centrifugal fan 19. In any other structural respect, the cooling device 15 according to the fourth embodiment is identical to the first embodiment.

As FIG. 13 shows, the fan case 37 has two brackets 71 and 72, which are shaped like a flat plate. The first bracket 71 is secured to one side of the fan case 37 and protrudes from the outlet port 40 toward the first end part 17a of the fin unit 17. The second bracket 72 is secured to the opposite side of the fan case 37 and protrudes from the outlet port 40 toward the second end part 17b of the fin unit 17. The first bracket 71 and second bracket 72 therefore oppose each other across the outlet port 40.

The first bracket 71 has a slit 73. In the slit 73, there is removably inserted the proximal end of the heat-radiating part 35b of the heat pipe 18. The slit 73 extends straight from the distal end of the first bracket 71 toward the fan case 37. The slit 73 is narrower than the diameter of the proximal end of the heat-radiating part 35b. The slit 73 has, at the midpoint, a holding part 74, in which the proximal end of the heat-radiating part 35b is fitted.

The second bracket 72 has a slit 75. In the slit 75, there is removably inserted the distal end of the heat-radiating part 35b of the heat pipe 18. The slit 75 extends straight from the distal end of the second bracket 72 toward the fan case 37. The slit 75 is narrower than the diameter of the distal end of the heat-radiating part 35b. The slit 75 has, at the midpoint, a holding part 76, in which the distal end of the heat-radiating part 35b is fitted.

To assemble the centrifugal fan 19 into the fin unit 17, the proximal end of the heat-radiating part 35b of the heat pipe 18 is inserted into the slit 73 of the first bracket 71. For the same purpose, the distal end of the heat-radiating part 35b of the heat pipe 18 is inserted into the slit 75 of the second bracket 72. Further, the heat-radiating part 35b is pushed along the slits 73 and 75, until the proximal and distal ends of the heat-radiating part 35b are fitted in the holding part 74 and 76, respectively.

Thus, the first and second brackets 71 and 72 couple the fan case 37 and the fin unit 17 together.

In the fourth embodiment, the centrifugal fan 19 can assume a specific position with respect to the fin unit 17 that receives cooling air. Hence, the centrifugal fan 19 and the fin unit 17 can be positioned with respect to each other with high precision. No gaps are therefore made between the centrifugal fan 19 and the fin unit 17. Thus, the cooling air would not leak at the junction between the fan 19 and the fin unit 17.

Figure 16:
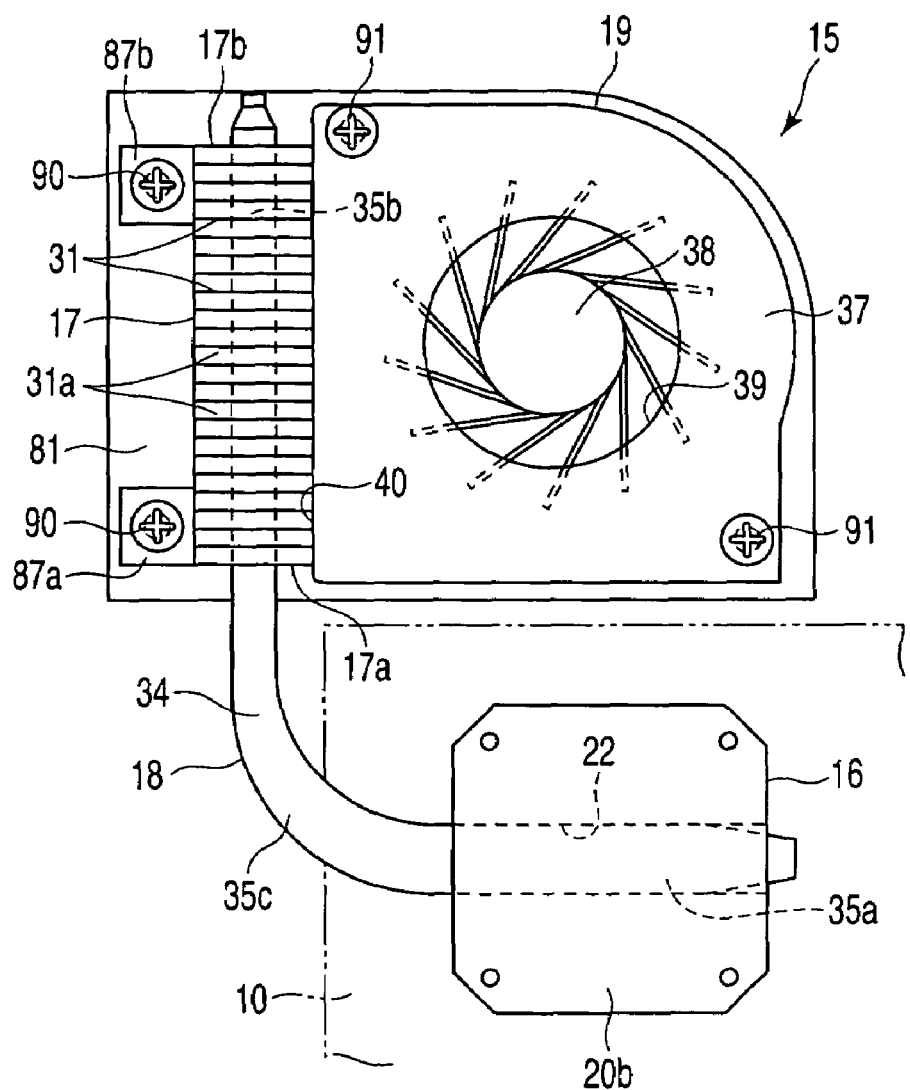
FIG. 16 is a plan view of a cooling device according to a fifth embodiment of the invention.
Figure 17:
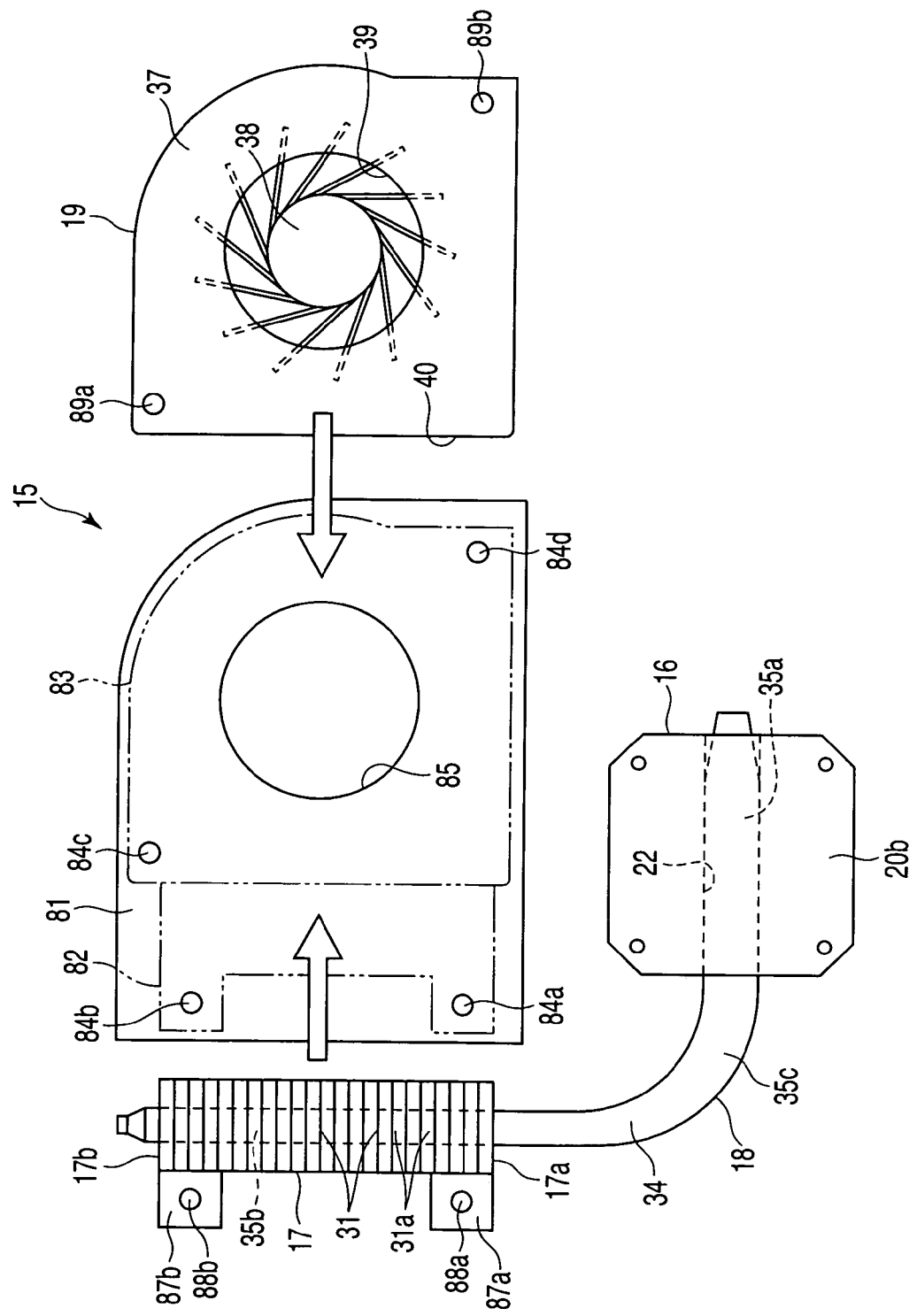
FIG. 17 is a plan view of the cooling device according to the fifth embodiment, showing the fin unit, centrifugal fan and support plate that are separated from one another.

FIGS. 16 and 17 show a fifth embodiment of this invention.

The fifth embodiment differs from the first embodiment in the structure that couples the fin unit 17 and the centrifugal fan 19. In any other structural respect, the cooling device 15 according to the fifth embodiment is identical to the first embodiment.

As FIGS. 16 and 17 show, a support member 81, which is shaped like a flat plate, couples the fin unit 17 and the centrifugal fan 19. The support member 81 has a first part 82 and a second part 83, which hold the fin unit 17 and the centrifugal fan 19, respectively. The first part 82 and second part 83 lie in the same plane, side by side. The support member 81 has first and second screw holes 84a and 84b in the first part 82, and third and fourth screw holes 84c and 84d and a through hole 85 in the second part 83. The through hole 85 is opposed to the inlet ports 39 of the fan case 37.

The fin unit 17 has a first bracket 87a and a second bracket 87b. The first bracket 87a projects from the first end part 17a, away from the centrifugal fan 19. The first bracket 87a has an insertion hole 88a that is axially aligned with the first screw hole 84a. The second bracket 87b projects from the second end part 17b, away from the centrifugal fan 19. The second bracket 87b has an insertion hole 88b that is axially aligned with the second screw hole 84b.

The fan case 37 of the centrifugal fan 19 has a pair of insertion holes 89a and 89b. These insertion holes 89a and 89b are axially aligned with the third and fourth screw holes 84c and 84d, respectively.

Two screws 90 fasten the fin unit 17 to the first part 82 of the support member 81. The screws 90 are driven into the first and second screw holes 84a and 84b, respectively, passing through the insertion holes 88a and 88b made in the brackets 87a and 87b of the fin unit 17.

Two screws 91 fasten the centrifugal fan 19 to the second part 83 of the support member 81. The screws 91 are driven into the third and fourth screw holes 84c and 84d, respectively, passing through the insertion holes 89a and 89b of the fan case 37.

The fin unit 17 and centrifugal fan 19 are thereby secured to the support member 81. In other words, the support member 81 couples the fin unit 17 and the centrifugal fan 19, forming an integral unit.

In the fifth embodiment, the fin unit 17 and the centrifugal fan 19 are positioned with respect to the same thing, i.e., the support member 81. Hence, the fin unit 17 and the centrifugal fan 19 are positioned relative to each other, with high precision. No gaps are made between the fin unit 17 and the centrifugal fan 19. Thus, the cooling air would not leak at the junction between the fin unit 17 and the centrifugal fan 19.

In the present invention, the heat-transferring component is not limited to the heat pipe. The heat pipe may not be used. If this is the case, liquid coolant may be circulated between the heat receiving portion and the heat radiating portion. To circulate the liquid coolant so, it is desired that the heat receiving portion should incorporate a pump that forces the liquid coolant to the heat radiating portion.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A cooling device for cooling a heat-generating component, comprising:
   a heat receiving portion thermally connected to the heat-generating component;
   a heat radiating portion which radiates heat generated by the heat-generating component, at a position remote from the heat receiving portion;
   a heat-transferring component which transfers the heat generated by the heat-generating component, from the heat receiving portion to the heat radiating portion, and which connects the heat receiving portion and the heat radiating portion; and
   a fan which applies cooling air to the heat radiating portion, wherein the heat radiating portion includes first and second brackets projecting toward the fan, and the fan is fixed to the first and second brackets so as to be held in a position with respect to the heat radiating portion.

2. The cooling device according to claim 1, wherein the heat-transferring component is a heat pipe which has a container made of metal, and the container defines a positional relation between the heat receiving portion and the heat radiating portion.

3. The cooling device according to claim 1, wherein the fan includes a fan case and an impeller provided in the fan case, the fan case having an outlet port for discharging cooling air and being coupled to the heat radiating portion, with the outlet port opposed to the first and second brackets.

4. The cooling device according to claim 1, wherein the heat receiving portion, the heat radiating portion and the heat-transferring component are assembled together, forming one module, and the module is secured to a wiring board, with the heat receiving portion held on the wiring board.

5. The cooling device according to claim 1, wherein the heat radiating portion includes a plurality of heat-exchanging plates arranged at intervales, a first end part located at one end of a row of the heat-exchanging plates, and a second end part located at other end of the row of the heat-exchanging plates, the first bracket being formed at the first end part of the heat radiating portion, the second bracket being formed at the second end part of the heat radiating portion.

6. A cooling device for cooling a heat-generating component, comprising:
   a heat receiving portion thermally connected to the heat-generating component;
   a fin unit which is provided remote from the heat receiving portion and has a plurality of heat-exchanging plates arranged at intervals, the fin unit having a first end part located at one end of a row of the heat-exchanging plates and a second end part located at other end of the row of the heat-exchanging plates;
   a heat-transferring component which has a metal pipe containing coolant and which transfers heat generated by the heat-generating component, from the heat receiving portion to the fin unit by using the coolant, the metal pipe coupling the heat receiving portion and the fin unit; and
   a fan which applies cooling air to the fin unit, wherein the fin unit includes a first bracket projecting from the first end part toward the fan and a second bracket projecting from the second end part toward the fan, and the fan is fixed to the first and second brackets so as to be held in a position with respect to the fin unit.

7. The cooling device according to claim 6, wherein the fan includes a fan case and an impeller provided in the fan case, the fan case having an outlet port for discharging cooling air and being removably held by the first and second brackets, with the outlet port opposed to the fin unit.

8. The cooling device according to claim 6, wherein the first bracket is formed at the heat-exchanging plate positioned at the first end part, and the second bracket is formed at the hear-exchanging plate positioned at the second end part.

9. An electronic apparatus comprising:
   a housing;
   a wiring board, which is provided in the housing;
   a heat-generating component which is mounted on the wiring board; and
   a cooling device which is provided in the housing to cool the heat-generating component and which includes (i) a heat receiving portion held on the wiring board and thermally connected to the hear-generating component, (ii) a heat radiating portion for radiating heat generated by the heat-generating component, at a position remote from the heat receiving portion, (iii) a heat-transferring component for transferring the heat generated by the heat-generating component, from the heat receiving portion to the heat radiating portion, and which connects the heat receiving portion and the heat radiating portion, and (iv) a fan for applying cooling air to the heat radiating portion, wherein the heat radiating portion includes first and second brackets projecting toward the fan, and the fan is fixed to the first and second brackets in the housing so as to be held in a position with respect to the heat radiation portion.

10. The electronic apparatus according to claim 9, wherein the heat receiving portion, the heat radiating portion and the heat-transferring component are assembled together, forming one module, and the module is secured to the wiring board, with the heat receiving portion held on the wiring board.

11. The electronic apparatus according to claim 9, wherein the fan comprises a fan case and an impeller provided in the fan case, the fan case having an outlet port for discharging cooling air and being held by the first and second brackets, with the outlet port opposed to the heat radiating portion, and the housing has an exhaust port which faces the heat radiating portion.

12. The electronic apparatus according to claim 9, wherein the heat radiating portion includes a plurality of heat-exchanging plates arranged at intervals, a first end part located at one end of a row of the heat-exchanging plates, and a second end part located at other end of row of the heat-exchanging plates, the first bracket being formed at the first end part of the heat radiating portion, the second bracket being formed at the second end part of the heat radiating portion.

* * * * *